United States Patent [19]
Anthony et al.
[11] 3,927,468
[45] Dec. 23, 1975

[54] SELF ALIGNED CCD ELEMENT FABRICATION METHOD THEREFOR

[75] Inventors: Michael P. Anthony, San Carlos; Kamleshwar Gunsagar, Cupertino; Choong-Ki Kim, Sunnyvale; Lloyd R. Walsh, San Jose, all of Calif.

[73] Assignee: Fairchild Camera and Instrument Corporation, Mountain View, Calif.

[22] Filed: Dec. 28, 1973

[21] Appl. No.: 429,329

[52] U.S. Cl. .................... 29/578; 29/589; 357/24
[51] Int. Cl.² .................... B01J 17/00
[58] Field of Search .................... 29/578, 571, 589, 576, 29/576 B; 357/24

[56] References Cited

UNITED STATES PATENTS

| | | | |
|---|---|---|---|
| 3,770,988 | 11/1973 | Engeler | 357/24 |
| 3,796,928 | 3/1974 | Doo | 357/24 |
| 3,810,795 | 5/1974 | Troutman | 357/24 |
| 3,852,799 | 12/1974 | Walden | 357/24 |

*Primary Examiner*—W. Tupman
*Attorney, Agent, or Firm*—Alan H. MacPherson; Norman E. Reitz

[57] ABSTRACT

The disclosure relates to a CCD (charge-coupled device) structure and fabrication method therefor, wherein self alignment is achieved between implanted barrier regions in the semiconductor substrate and gate portions of the CCD structure during the fabrication thereof. Additionally, the gate electrodes of the CCD structure are formed in a manner which provides very narrow gaps between electrodes. Multiple layers of insulation are used to form the final CCD structure including the use of two separated layers of silicon nitride. The orthogonal gate electrodes are made of a metal such as aluminum and doped polycrystalline silicon.

5 Claims, 14 Drawing Figures

SELF ALIGNED CCD ELEMENT FABRICATION METHOD THEREFOR

BACKGROUND OF THE INVENTION

1. Field of the Invention

This invention relates to CCD (charge-coupled device) elements including fabrication methods therefor and, more particularly, to self aligned CCD structures including methods for the fabrication of such self aligned structures.

2. Description of the Prior Art

A number of publications and patents describe the basic theory of operation of the charge-coupled semiconductor device. These publications include an article by Boyle and Smith published in the April, 1970 *Bell System Technical Journal*, page 587, entitled "Charge-Coupled Semiconductor Devices"; and a paper on page 593 of the same *Bell System Technical Journal* by Amelio et al. entitled "Experimental Verification of the Charge-Coupled Device Concept".

Various CCD structures have been developed in the past for use as shift registers, photosensitive devices, etc. These CCD structures have been fabricated using fairly complex process steps in order to obtain even a simple two phase CCD electrode system. Due to the complexity of the number of process steps needed to form both the desired semiconductor regions and the insulating and conducting regions on the surface of the semiconducting substrate, errors of misalignment of the gate electrodes with respect to implanted barrier regions which were caused during the fabrication process resulted in the failure of the entire CCD structure. In other instances, the errors in misalignment of the gate electrodes produced undesirable "glitches", wherein glitches are defined as undesirable irregularities in the potential profile. As a result, semiconductor manufacturers tried to solve this important alignment problem by using fabrication process techniques which would provide larger tolerances between these two portions of the CCD structure. However, this type of solution was not desirable in fabricating low cost, high density CCD structures.

A CCD structure comprises a multiplicity of potential wells within a semiconductor substrate. The potential well is employed for storing, or accumulating, packets of charge. The accumulated packets of charge comprise carriers which are minority in relation to the conductivity type of the predominant impurity in the substrate containing the potential wells. Barriers are implanted periodically in the surface of the substrate at intervals which define the lateral extremities of the potential wells. The barriers also function to effect unidirectional flow of the charge packets. In some prior art CCD structures the size of the implanted barriers, and the size of the potential wells between adjacent barriers, varies. This resulted in a restriction on the charge handling capabilities of the CCD structure.

A need existed to develop a process and a CCD structure that would have self alignment features which would permit the gate electrodes of the two phase system to be in substantial self alignment with the implanted barrier regions cooperatively and electrically coupled to the overlying gate electrodes. Also, a need existed for a process and a resultant CCD structure that would provide uniformity of implanted barrier size, and uniformity of potential well size.

SUMMARY OF THE INVENTION

Accordingly, it is an object of this invention to provide a self aligned CCD structure.

It is another object of this invention to provide a process for fabricating a self aligned CCD structure.

It is still another object of this invention to provide an improved two phase self aligned CCD structure.

It is a still further object of this invention to provide a process for fabricating a two phase self aligned CCD structure.

Still another object of this invention is to provide a CCD structure having uniform sizes of implanted barriers and potential wells between the barriers.

DESCRIPTION OF THE PREFERRED EMBODIMENTS

In accordance with one embodiment of this invention, a process is disclosed for fabricating a CCD self aligned semiconductor structure. Gate electrodes are formed over implanted barrier regions located in a semiconductor substrate. The gate electrodes are formed after previously removing defined or identified regions located over the implanted barrier regions which precisely define the distance from the leading edge of alternate implanted barrier regions to the leading edge of the next adjacent implanted barrier regions. The term "leading edge" as used herein refers to the edge of the barrier first encountered by charge packets flowing in the preferred direction of flow through the CCD substrate. Preferably, the gate electrodes are made of metal and are deposited by metal deposition techniques. The previously defined or identified regions that are removed are preferably removed by etching techniques. In particular, silicon dioxide and silicon nitride insulating regions are used to precisely define the distance defined above with respect to alternate and adjacent implanted barrier regions. Gate electrodes of doped polycrystalline silicon are also used with the metal gate electrodes to define the two phase CCD structure fabricated in accordance with the process of this invention.

In accordance with another embodiment of this invention, a self aligned CCD structure is disclosed which contains silicon nitride and silicon dioxide layers located on the surface region of the semiconductor substrate which contains implanted barrier regions. Doped polycrystalline silicon gate electrodes are separated from metal gate electrodes by only a thin insulating layer of silicon dioxide.

The foregoing, and other objects, features and advantages of the invention will be apparent from the following, more particular description of the preferred embodiment of the invention, as illustrated in the accompanying drawing.

DESCRIPTION OF THE SPECIFICATION

Figure 1:
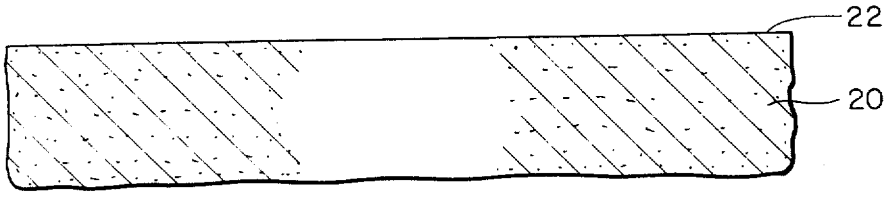
FIG. 1 is an elevational cross-sectional view of a semiconductor substrate.

Referring to FIG. 1, a semiconductor substrate or wafer 20 is used as the starting structure for the fabrication of the final CCD structure. Preferably, the substrate 20 is a silicon slice of $p^-$type conductivity comprising, for example, a boron doped substrate containing $5 \times 10^{14}$ impurities per cubic centimeter and has a thickness of about 150 microns. Although the described embodiment preferably uses a silicon semiconductor substrate, it is evident to those skilled in the art that other semiconductor materials may be used. Furthermore, the conductivity type regions described in the embodiment shown in the Figures can be of opposite type conductivity, if desired, in order to provide a CCD structure using charge packets with the opposite type of minority carriers.

After the fabrication of the $p^-$type substrate 20 such as by slicing a Boron-doped monocrystalline silicon rod followed by lapping and polishing the sliced substrate surface to obtain the desired mirror-like surface finish, usual cleaning steps using deionized water, hydrogen gas, etc. are carried out to further prepare substrate surface 22 for further processing steps.

Figure 2:
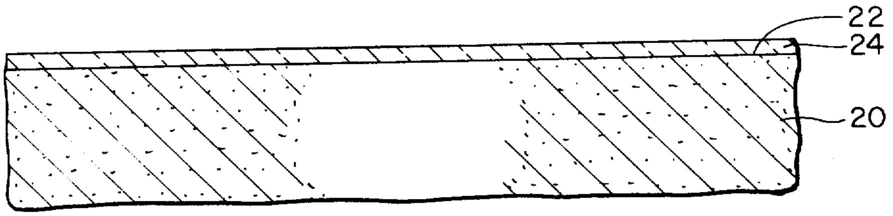
FIG. 2 is an elevational cross-sectional view of the semiconductor substrate of FIG. 1 with a first insulating layer formed on one surface of the substrate.

Referring to FIG. 2, an insulating layer 24 preferably of $SiO_2$ is formed on the substrate surface 22 by well known thermal oxidation techniques. In one example, the thermally grown $SiO_2$ layer had a thickness of 1000 Angstrom units.

Figure 3:
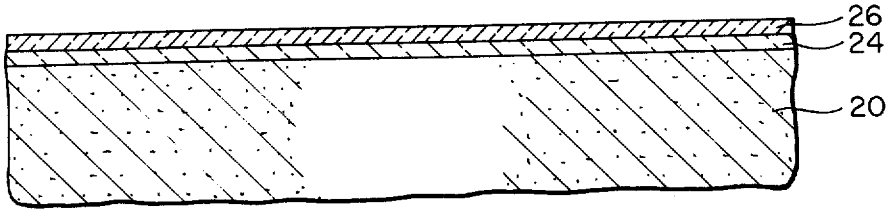
FIG. 3 is a view similar to FIG. 2 with a second insulating layer formed on top of the first insulating layer.

Referring to FIG. 3, a second insulating layer 26 is deposited or formed on top of the first insulating layer 24. The second insulating layer 26 is preferably made of silicon nitride which is deposited by well known techniques used by those skilled in the art of depositing or forming thin layers of silicon nitride. In the example where the first insulating layer 24 was 1000 Angstrom units thick, the silicon nitride layer 26 was also 1000 Angstrom units thick. Silicon nitride is preferred as the second insulating layer 26 because it is very useful in protecting the underlying $SiO_2$ layer 24 from becoming significantly thicker which would normally occur during the subsequent heat treatment steps in the process of fabricating the final CCD structure of this invention. Additionally, the silicon nitride layer 26 functions as a further protective layer against pinholes in the underlying $SiO_2$ layer 24.

Figure 4:
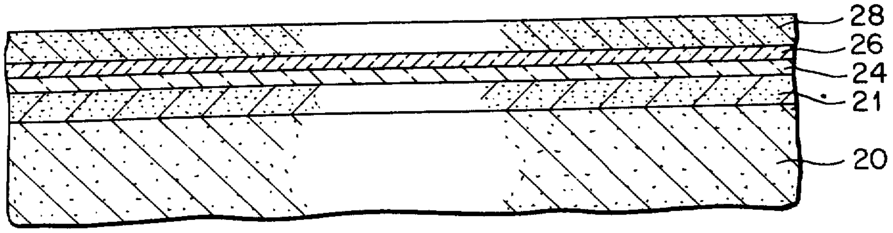
FIG. 4 is a view similar to FIG. 3 with a polycrystalline silicon layer formed on top of the second insulating layer and a buried region formed on the surface portion of the semiconductor substrate.

Referring to FIG. 4, a polycrystalline silicon layer 28 is deposited on top of the second insulating layer 24. The polycrystalline silicon layer 28 is a doped layer containing impurities of a sufficient quantity to permit the doped polycrystalline silicon layer 28 to function as an electrical conductor or gate electrode. Preferably, the polycrystalline silicon layer is a phosphorous doped layer containing sufficient amounts of phosphorous impurity atoms to permit the doped polycrystalline silicon layer 28 to function as an electrical conductor or gate electrode element. In one embodiment, the doped polycrystalline silicon layer 28 has a thickness of about 3,000 to about 4,000 Angstroms.

A buried $n^-$type region 21 is formed in the surface portion of the semiconductor substrate 20 by ion implantation techniques using Arsenic or Phosphorous as the $n^-$type dopant ions for the region 21.

In one example, the $n^-$type region 21 has a thickness of about ½ micron and a phosphorous impurity level of, for example, $3 \times 10^{16}$ atoms per cubic centimeter. The operation and function of the buried channel region 21 and the subsequently formed $n^-$ implanted barrier regions is set forth in the copending patent application of Bechtel et al. entitled "Buried Channel Charge Coupled Devices", filed Oct. 10, 1972, Ser. No. 296,507 and assigned to the same assignee of the subject application. The buried $n^-$type region 21 can be formed before or after the formation of the doped polycrystalline silicon layer 28. Channel stop regions of $p^+$ type conductivity (not shown) can also be formed in the surface portion of the substrate 20 using Boron ions in an ion implantation operation at an earlier stage in the process preferably before the formation of the $n^-$type buried region 21. The function of the $p^+$ channel stop region is disclosed in "Charge-Coupled Imaging Devices: Experimental Results", Tompsett et al, *IEEE Transactions on Electron Devices*, Vol. ED-18, No. -1, November 1971, pp. 992–996.

Figure 5:
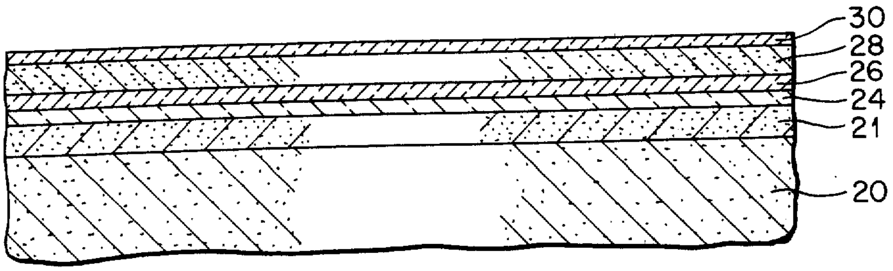
FIG. 5 is a view similar to FIG. 4 with a third insulating layer formed on top of the polycrystalline silicon layer.

Referring to FIG. 5, an overlying insulating layer 30 is formed or deposited on top of the doped polycrystalline silicon layer 28. Preferably, the overlying insulating layer 30 is made of silicon nitride and has a thickness of about 200 Angstroms. Portions of this silicon nitride layer are used as a masking layer in subsequent process steps in fabricating the CCD structure of this invention.

Figure 6:
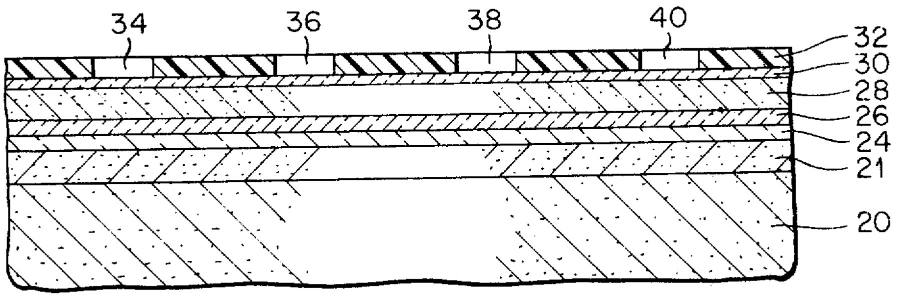
FIG. 6 is a view similar to FIG. 5 with a photoresist pattern formed on the top surface of the third insulating layer.

Referring to FIG. 6, a photoresist layer 32 is deposited by conventional deposition techniques and developed (using photolithographic masking and etching techniques) to define a pattern with openings 34, 36, 38, and 40 formed therein. For example, these openings can be from about 0.1 to about 0.15 mils and are used to subsequently define ion implanted barrier regions that are to be formed in the silicon substrate 20.

Figure 7:
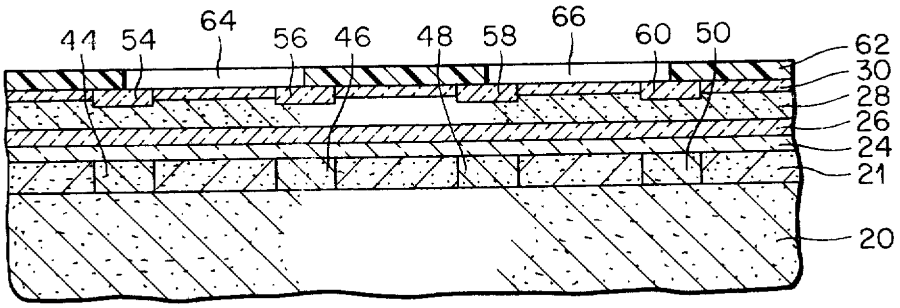
FIG. 7 is a view similar to FIG. 6 after (a) portions of the third insulating layer have been etched away beneath the openings in the photoresist, (b) the implanted barrier regions have been formed in the semiconductor substrate by ion-implantation techniques, (c) the photoresist pattern is stripped, (d) thermal oxidation is carried out to form $SiO_2$ regions in the third insulating layer, and (e) a new photoresist pattern is formed on the surface of the resulting structure.

Referring to FIG. 7, a number of process steps are carried out to fabricate the structure shown in this figure. The first process step that is carried out is to etch openings in the silicon nitride layer 30 using a layer 32 comprising photoresist and vapox as a photolithographic mask to prevent etching away unselected areas of the silicon nitride layer 30. The etchant used is any of the known etchants used to etch silicon nitride or, if desired, reverse sputtering techniques can be used to open the desired holes in the silicon nitride layer 30.

The next process step is to carry out an ion-implantation operation which serves to implant desired impurity ions in the silicon substrate 20 through the openings formed in the silicon nitride layer 30. Accordingly, ion-implanted barrier regions 44, 46, 48, and 50 are formed beneath corresponding openings 34, 36, 38, and 40 respectively located in the photoresist layer 32. Since the ion-implantation step that is carried out in this part of the process is to form $n^-$ regions in the existing $n^-$type buried region 21, Boron (or other desired $p^+$type ions are used to convert the selected portions of the $n^-$type buried region 21 to $n^-$type implanted barrier regions 44, 46, 48, and 50.

The next step in the process of forming the structure of FIG. 7 is the stripping off of the photoresist pattern layer 32. This is done with the use of conventional photoresist removal solutions.

Subsequent to the photoresist stripping step, a thermal oxidation process step is carried out using standard thermal oxidation techniques to form oxide (silicon dioxide) regions 54, 56, 58, and 60 in the surface regions of the doped polycrystalline silicon layer 28 beneath the openings that were formed in the silicon nitride layer 30, which were formed below the openings 34, 36, 38, and 40 (of FIG. 6) within the photoresist layer 32. Consequently, portions of the silicon nitride insulating layer 30 contain thermal oxide regions 54, 56, 58, and 60.

Figure 8:
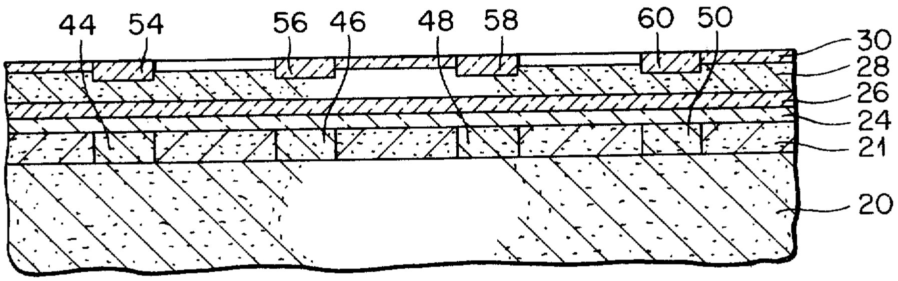
FIG. 8 is a view similar to FIG. 7 after selective removal of portions of the third insulating layer.

The final step in fabricating the resulting structure of FIG. 7 is the deposition of another photoresist layer 62 and the formation therein of a desired pattern using conventional photolithographic masking and etching techniques. Accordingly, openings 64 and 66 are developed in the photoresist layer 62 (between oxide regions 54, 56, and 58, 60). The oxide regions 54, 56, 58, and 60 are used as an etch resistant mask along with the photoresist layer 62 for the silicon nitride etchant which is used to etch out the portions of the silicon nitride layer 30. Subsequent to the silicon nitride etching operation, the photoresist layer 62 is removed to permit subsequent process steps to be carried out as illustrated in the remaining figures. The resultant structure following these steps is shown in FIG. 8.

Figure 9:
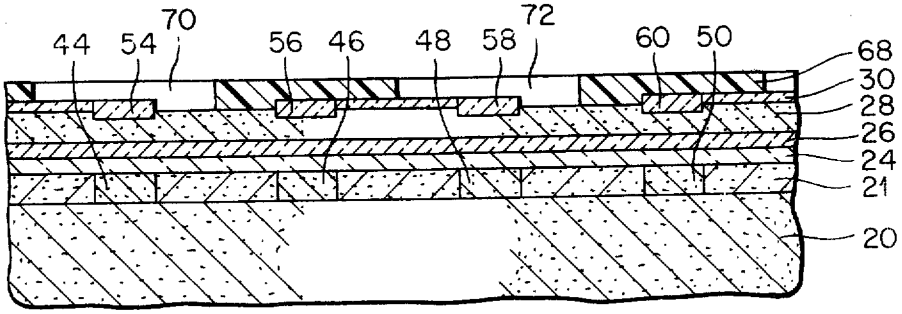
FIG. 9 is a view similar to FIG. 8 after a new photoresist pattern has been formed on the surface of the structure of FIG. 8.

Referring to FIG. 9, another photoresist layer 68 is deposited and formed into the pattern shown in FIG. 9. Thus, openings 70 and 72 are formed in the photoresist layer 68 using standard photolithographic masking and etching operations.

Figure 10:
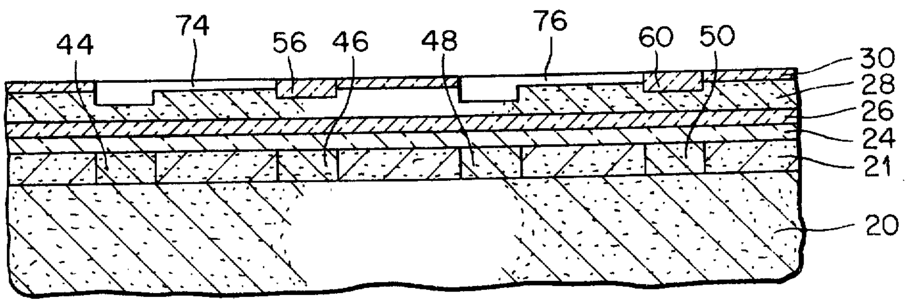
FIG. 10 is a view similar to FIG. 9 after the oxide portions located in the third insulating layer beneath the openings in the photoresist layer have been etched away.

Referring to FIG. 10, an oxide etching operation is performed to remove the oxide regions 54 and 58 located in the openings 70 and 72 of the structure of FIG. 9. Next, the photoresist layer 68 is removed thereby exposing openings 74 and 76 (as shown in FIG. 10). As a result, the structure shown in FIG. 10 is ready for an etching operation to be performed to etch out regions of the doped polycrystalling silicon layer 28 in a desired pattern defined by the openings 74 and 76. Thus, the remaining oxide regions 56 and 60 and the associated remaining regions of the silicon nitride layer 30 function as an etch resistant mask to protect selected areas of the doped polycrystalline silicon layer 28.

Figure 11:
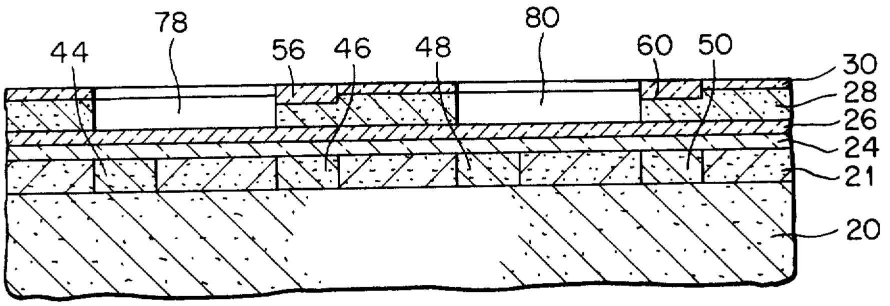
FIG. 11 is a view similar to FIG. 10 after portions of the polycrystalline silicon layer located beneath the openings formed in the third insulating layer and oxide portions thereof have been etched away.

Referring to FIG. 11, an etching operation is performed to etch away portions of the doped polycrystalline silicon layer 28 to define the pattern shown in FIG. 11. The etchant used is any known etchant used to etch polycrystalline silicon. Openings 78 and 80 are formed in the doped polycrystalline silicon layer 28.

Figure 12:
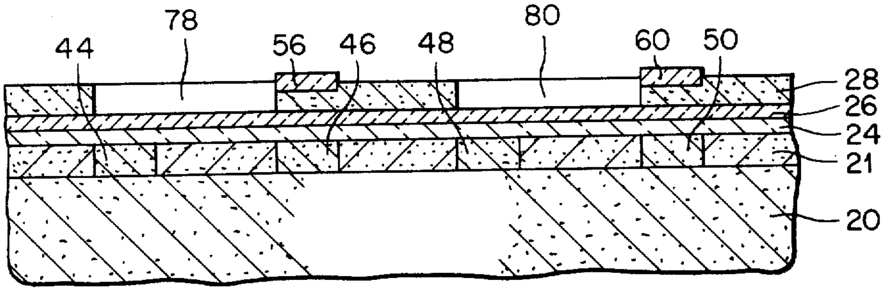
FIG. 12 is a view similar to FIG. 11 after removal of the original portions of the third insulating layer.
Figure 13:
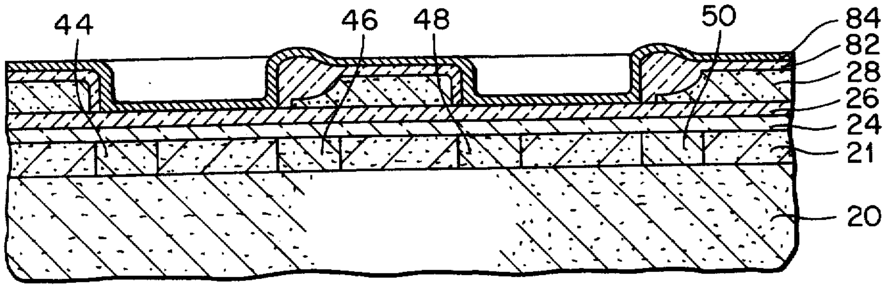
FIG. 13 is the final CCD structure after the formation of an electrically conducting metal layer on the top insulating layer formed during the fabrication step of FIG. 12A or after the formation of an insulating surface layer on the structure of FIG. 12 prior to the deposition of an electrically conducting metal layer.

Referring to FIG. 12, which discloses one way in deriving the final CCD structure shown in FIG. 13 (FIG. 12A being another way in deriving the CCD structure of FIG. 13), an etching operation is carried out to etch away the remaining surface regions of the silicon nitride layer 30. Since the silicon nitride layer 30 is much thinner than the silicon nitride layer 26, a substantial portion of the silicon nitride layer 26 remains in place after the silicon nitride etching operation that is used to etch away the remaining portions of the silicon nitride layer 30. At this point in the process, the surface of the structure of FIG. 12 is ready for the partial formation of a protective surface insulating layer followed by the formation of a metal conductive layer to complete the formation of an electrically separated, orthogonal, two phase, gate electrode pattern above implanted barrier regions 44, 46, 48, and 50 to provide the disclosed CCD structure.

Referring to FIG. 13, a thermal oxidation operation is performed to form an insulating layer 82, preferably having a thickness of about 3,000 Angstroms, that covers only the surface portions of the doped polycrystalline silicon regions 28 and thereby provides a protective electrical insulation between the doped polycrystalline silicon regions 28 and a metal layer 84 deposited as a final layer on the surface of the CCD structure of FIG. 13. Preferably, the metal layer 84 is aluminum deposited by, for example, vapor deposition, E-gun, R. F. Sputtering, etc. techniques. If desired, the conductor 84 can be formed by depositing another layer of doped polycrystalline silicon onto the surface of the structure.

The CCD structure disclosed herein can be employed as an imaging device similar to that disclosed in copending patent application Ser. No. 391,119, entitled "Charge-Coupled Area Array" by Lloyd R. Walsh filed Aug. 27, 1973, and assigned in common with this application. If this structure is employed in such an imaging device, layer 84 would comprise polycrystalline silicon over the light sensing elements and an opaque material (such as aluminum) over other areas of the array where the impingement of incident light on the CCD substrate is undesirable.

Charge packets will flow from left to right in the structure illustrated in FIG. 13, wherein "left" and "right" are intended to apply only to the positions of the surfaces as illustrated in the drawings. The left edge of the barriers 44, 46, 48, and 50 are the edges first encountered by the flowing charge packets, and therefore consititute the "leading edges" as defined above.

After the formation of the conductor layer 84, the desired metal gate interconnection pattern is formed by a metal etching operation which etches out a defined pattern. The final CCD structure shown in FIG. 13 is a two phase, ion implanted barrier CCD arrangement wherein self alignment is achieved between the ion implanted $n^-$ barrier regions and the respective (metal or doped polycrystalline silicon) gate electrodes associated therewith which serve to electrically open in a selective manner the barrier regions to permit charge packets to be transmitted in shift register function along the surface of the CCD structure. Additionally, very narrow gaps are formed between gate electrodes (approximately 0.3 microns) by means of the disclosed self-alignment method or process which thereby eliminates the possibility of having glitches that normally are present in non-self aligned CCD structures of the prior art.

The disclosed fabrication method for forming the CCD structure of FIG. 13 permits optimum utilization of semiconductor real estate thereby permitting higher CCD element densities. Alternatively, if the same cell size used in prior art devices is employed, increased charge handling capabilities are provided because of increased charge storage area resulting from uniform cell sizes.

In fabricating the final CCD structure shown in FIG. 13 various alternatives are possible such as, for example, elimination of the buried channel $n^-$type region 21 and the use of a more conventional surface channel which would be the same conductivity type as the $p^-$substrate 20.

Figure 12A:
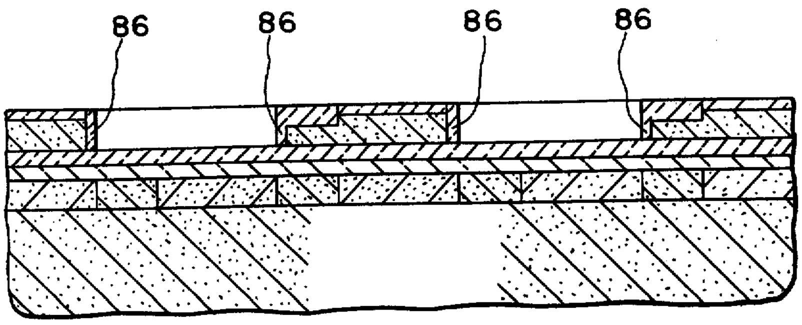
FIG. 12A is an alternative step in the fabrication process similar to FIG. 11 after the formation of an insulating layer on the remaining exposed surface portions of the polycrystalline regions without removal of the original portions of the third insulating layer.

Referring to FIG. 12A another process step is shown in lieu of the process step exemplified by FIG. 12. In the embodiment of FIG. 12A, instead of removing the remaining portions of the silicon nitride layer 30 as was done in FIG. 12, the remaining portions of the silicon nitride layer 30 are left on and a thermal oxidation step or other type of oxide deposition operation is carried out to form the insulating regions 86 on the sides of the doped polycrystalline silicon regions 28. Subsequent to the formation of the oxide or insulating regions 86, the metal electrode 84 is deposited onto the structure of FIG. 12A to provide the arrangement shown in FIG. 13.

SELF ALIGNMENT

As can be seen with reference to FIG. 13, the lower portions of the metal gate electrode 84 are in identical self alignment with the implanted barrier regions 44, 48, etc. whereas the doped polycrystalline silicon regions 28 are in substantial alignment (except for the thickness of the oxide region separating the metal conductor layer 84 and the doped polycrystalline region 28) with the implanted barrier regions 46, 50, etc. This two phase system using the conductor layer 84 as one of the two gate electrodes and the doped polycrystalline silicon regions 28 as the second of the two gate electrodes provides a CCD structure that is in self alignment with the implanted barrier regions due to the fabrication process disclosed herein. The implanted barrier regions 44, 46, 48, and 50 are associated with both sets of electrodes of the two phase electrode system so that charge packets can be transferred through the barrier regions upon the application of a particular voltage (of a sufficient magnitude and having the right polarity) to the gate electrodes associated with the particular implanted barrier regions located thereunder. The operation of how charge packets are transferred through barrier regions of a two phase system is, for example, shown in the above-cited copending patent application Ser. No. 391,119 by Lloyd R. Walsh, now abandoned.

While the invention has been particularly shown and described in reference to the preferred embodiment thereof, it will be understood by those skilled in the art that changes in the form and details may be made therein without departing from the spirit and scope of the invention.

We claim:

1. A process for fabricating a self-aligned charge-coupled semiconductor structure comprising the steps of:
   a. forming at least one insulating layer on one surface of a semiconductor substrate;
   b. forming a layer of electrically conducting material on said at least one insulating layer;
   c. forming an overlying insulating layer on said layer of electrically conducting material;
   d. removing portions of said overlying insulating layer at regular intervals to demarcate the location of barrier regions to be formed in underlying registration in said substrate;
   e. forming implanted barrier regions in the top-most portion of said semiconductor substrate at regular intervals along said substrate;
   f. forming filled-in insulating regions within said removed portions, wherein said filled-in insulating regions are of a material different from said overlying insulating layer;
   g. removing alternating remaining portions of said overlying insulating layer and those said filled-in insulating regions above a first series of alternate barrier regions to expose portions of said conducting material;
   h. removing the exposed portions of said conducting material using those still remaining portions of said overlying insulating layer and said filled-in insulating regions as a mask wherein the remaining portions of said layer of conducting material constitute a first set of gate electrodes which have edges in substantial alignment with leading edges of the other alternate series of implanted barrier regions;
   i. forming insulating material over said first set of gate electrodes; and
   j. applying a further layer of electrically conducting material over the exposed areas of said at least one layer of insulating material, said further layer of conducting material forming a second set of gate electrodes having edges in alignment with the leading edges of a second alternate series of said implanted barrier regions.

2. A process as claimed in claim 1 wherein said layer of electrically conducting material is a layer of doped polycrystalline silicon.

3. A process as claimed in claim 2 wherein said at least one layer of insulating material comprises a layer of silicon nitride formed over a layer of silicon dioxide.

4. A process as claimed in claim 3 including after said step of forming implanted barrier regions in the top-most portion of said semiconductor substrate at regular intervals along said substrate the step of
   forming a buried channel region in said substrate.

5. A process as claimed in claim 3 wherein said step of forming implanted barrier regions in the top-most portion of said semiconductor substrate at regular intervals along said substrate is accomplished by the steps of
   applying a patterned photoresist mask to said overlying insulating layer; and
   implanting ions through the openings in said patterned photoresist mask.

* * * * *